US012610576B2

(12) United States Patent
Borisov et al.

(10) Patent No.: US 12,610,576 B2
(45) Date of Patent: Apr. 21, 2026

(54) GATE STRUCTURE OVER CORNER SEGMENT OF SEMICONDUCTOR REGION

(71) Applicant: GlobalFoundries U.S. Inc., Malta, NY (US)

(72) Inventors: Kiril Biserov Borisov, Sofia (BG); Mohammed Ahmed Fouad Ibrahim Darwish, Dresden (DE); Francois C. Weisbuch, Dresden (DE); Shady Ahmed Abdelwahed Ahmed Elshafie, Dresden (DE); David Charles Pritchard, Schenectady, NY (US); Benoit Francois Claude Ramadout, Dresden (DE)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 535 days.

(21) Appl. No.: 18/058,353

(22) Filed: Nov. 23, 2022

(65) Prior Publication Data

US 2024/0170575 A1 May 23, 2024

(51) Int. Cl.
*H10D 64/00* (2025.01)
*H10D 30/60* (2025.01)
(52) U.S. Cl.
CPC ................................. *H10D 30/611* (2025.01)
(58) Field of Classification Search
CPC .. H10D 30/611; H10D 62/126; H10D 64/518; H10D 64/311; H10D 64/519; H10D 89/10; H10D 30/601; H10D 30/605
See application file for complete search history.

(56) References Cited

U.S. PATENT DOCUMENTS

| | | | |
|---|---|---|---|
| 7,473,623 B2 | 1/2009 | Chen et al. | |
| 8,350,253 B1 | 1/2013 | Zhu et al. | |
| 8,618,607 B1 | 12/2013 | Rashed et al. | |
| 8,748,270 B1 * | 6/2014 | Shifren ................ | H10D 62/307 |
| | | | 438/289 |
| 11,195,715 B2 | 12/2021 | Adusumilli et al. | |

(Continued)

FOREIGN PATENT DOCUMENTS

| | | |
|---|---|---|
| JP | 2006344873 A | 12/2006 |
| JP | 2008041886 A | 2/2008 |

(Continued)

OTHER PUBLICATIONS

"May." Merriam-Webster.com. 2025. https://www.merriam-webster.com (Jul. 2, 2025). (Year: 2025).*

(Continued)

*Primary Examiner* — Reema Patel
(74) *Attorney, Agent, or Firm* — Anthony Canale; Hoffman Warnick LLC

(57) ABSTRACT

Embodiments of the disclosure provide a gate structure over a corner segment of a semiconductor region. A structure according to the disclosure includes a semiconductor region within a substrate. The semiconductor region includes a first edge, a second edge oriented perpendicularly to the first edge, and a first corner segment connecting the first edge to the second edge. A first gate structure extends over the first edge, and entirely covers the first edge and the first corner segment of the semiconductor region.

20 Claims, 11 Drawing Sheets

(56)     References Cited

U.S. PATENT DOCUMENTS

| | | | | |
|---|---|---|---|---|
| 2006/0038233 A1* | 2/2006 | Otsuki | ................. | H10D 64/519 |
| | | | | 257/E29.264 |
| 2015/0001596 A1* | 1/2015 | Lee | ........................ | H10D 30/60 |
| | | | | 257/288 |
| 2015/0348969 A1* | 12/2015 | Edwards | ............. | H10D 62/235 |
| | | | | 438/307 |
| 2017/0222050 A1* | 8/2017 | Chen | ...................... | H10D 62/80 |

FOREIGN PATENT DOCUMENTS

| | | |
|---|---|---|
| JP | 4104574 B2 | 6/2008 |
| KR | 101492807 B1 | 2/2015 |

OTHER PUBLICATIONS

European Search Report for corresponding EP Application No. 23196323.2-1212 dated Mar. 11, 2024, 14 pages.
European Search Report for corresponding EP Application No. 23196323.2-1211 dated Jul. 3, 2024, 15 pages.

* cited by examiner

GATE STRUCTURE OVER CORNER SEGMENT OF SEMICONDUCTOR REGION

BACKGROUND

1. Technical Field

The present disclosure relates to integrated circuit (IC) technology. Embodiments of the disclosure provide a structure with a gate structure over the corner segment of a semiconductor region.

2. Background Art

Fabricating transistors within integrated circuits (ICs) may include, in a variety of orders: doping semiconductor material, forming a gate structure over the semiconductor material, epitaxially growing source and drain terminals from the semiconductor material, forming silicide regions in active semiconductor material, and forming conductors to the source/drain terminals and gate. For source and drain terminals formed by epitaxial growth over the substrate, an electrically inactive gate (e.g., diffusion break structure) may be at an edge of the semiconductor material to provide a physical boundary to prevent subsequently formed materials from protruding into the substrate, and/or for epitaxial growth and/or silicide formation. A possible disadvantage to this methodology is that conductive contacts to the raised source or drain terminal, especially in proximity to the corner of the semiconductor material, may penetrate thinner portions of the semiconductor material near the inactive gate(s), thus directly connecting to the substrate in undesirable areas.

SUMMARY

All aspects, examples and features mentioned below can be combined in any technically possible way.

An aspect of the disclosure provides a structure including: a semiconductor region within a substrate, the semiconductor region having a first edge, a second edge oriented perpendicularly to the first edge, and a first corner segment connecting the first edge to the second edge; and a first gate structure extending over the first edge, wherein the first gate structure entirely covers the first edge and the first corner segment of the semiconductor region.

Another aspect of the disclosure provides a semiconductor region within a substrate, the semiconductor region having a width between a first edge and a second edge; and a first gate structure extending over the first edge of the semiconductor region, wherein the first gate structure includes: a first portion having a first width, and a second portion having a second width greater than the first width, wherein the second portion is over a corner segment of the semiconductor region.

Yet another aspect of the disclosure provides a structure including: a semiconductor region within a substrate, the semiconductor region having a first edge, a second edge oriented perpendicularly to the first edge, and a first corner segment connecting the first edge to the second edge; a first gate structure extending over the first edge; and a masking material over the semiconductor region and the first gate structure, wherein the first gate structure and the masking material entirely cover the first edge and the first corner segment of the semiconductor region.

Two or more aspects described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
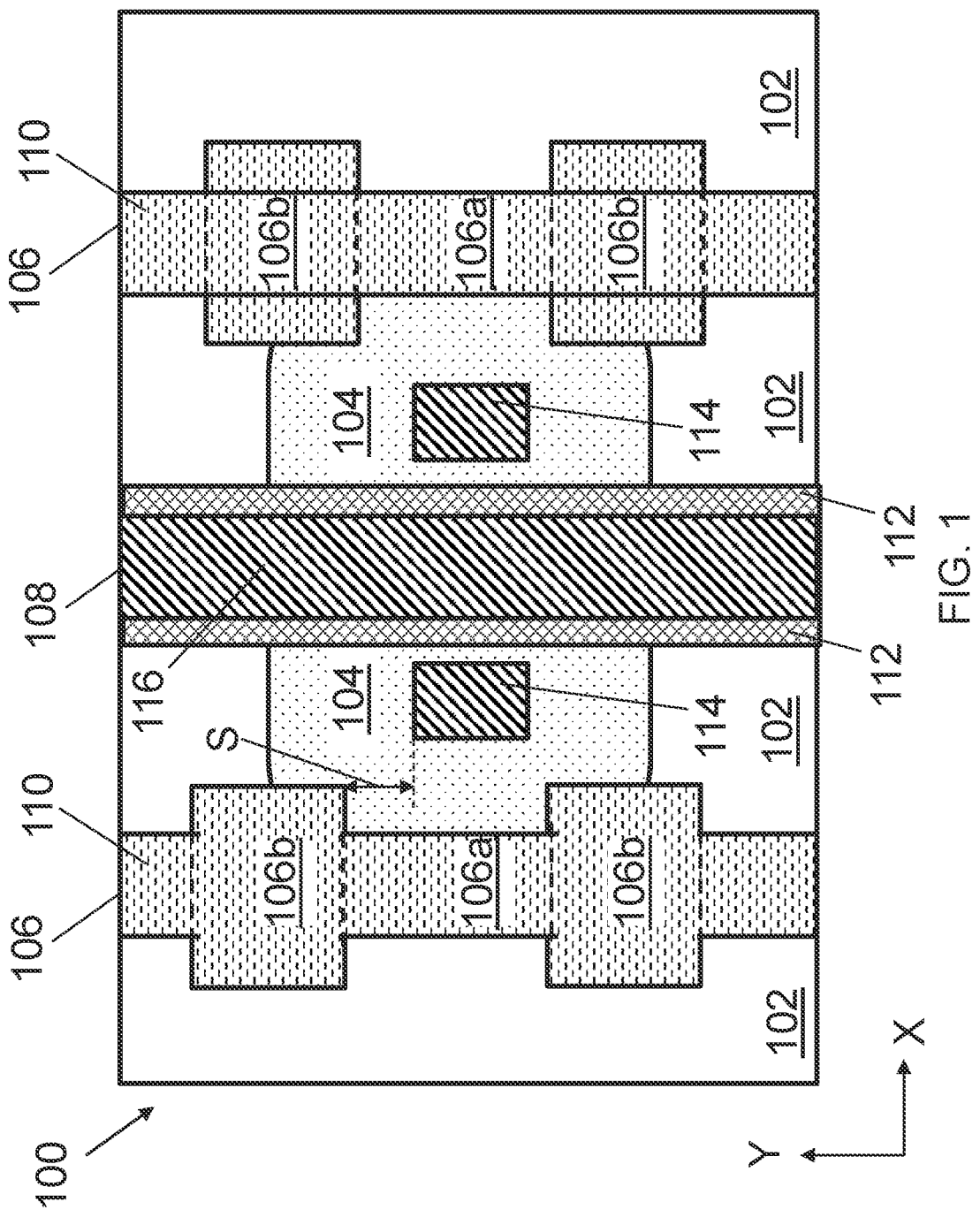
FIG. 1 shows a plan view of a structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a gate structure over a corner segment of a semiconductor region. The gate structure constrains epitaxial growth of source/drain (S/D) material formed on the semiconductor region, permits forming of contacts to the S/D material and maintains a desired surface area for transistor components to conform with product specifications (e.g., standard cell sizes). A structure according to the disclosure includes a semiconductor region within a substrate. The semiconductor region includes a first edge, a second edge oriented perpendicularly to the first edge. A corner segment connects the first edge to the second edge, e.g., through a rounded or otherwise curvilinear segment for joining the two differently oriented edges. A first (e.g., non-active) gate structure extends over the first edge, and entirely covers the first edge and the corner segment of the semiconductor region. Thus, the corner segment is entirely below the first gate-structure to prevent epitaxial semiconductor material from growing over the corner segment. Further embodiments may include masking material over the first gate structure and/or corner segment to further confine epitaxial growth to a desired area.

FIG. 1 depicts a plan view of a structure 100 according to embodiments of the disclosure. Structure 100 may represent part of a larger segment of material distributed across a two-dimensional area in plane X-Y. Structure 100 may be formed on a substrate of semiconductor material, which may be the base material on/within which further materials (e.g., variously doped well regions, transistor structures, insulator regions, and/or other electrical components of a device) are formed. The substrate may include but is not limited to silicon, germanium, silicon germanium (SiGe), silicon carbide, or any other common IC semiconductor substrates. In the case of SiGe, the germanium concentration in the substrate may differ from other SiGe-based structures described herein. A portion or entirety of the substrate may be strained. Various portions of structure 100 may be formed on or from portions of the initial substrate material, and thus it is not specifically identified in the plan view of FIG. 1 and subsequent illustrations.

Structure 100 extends horizontally within the X-Y plane. Each material or component of structure 100 may have a width in the X direction and a length in the Y direction. However, the "width" and "length" directions may refer to different orientations in further embodiments. Structure 100 may include a group of trench isolation (TI) regions 102 to electrically separate various regions of doped semiconductor material 104 from each other. TI regions 102 may be composed of any insulating material such as silicon oxide, e.g., $SiO_2$. Other materials appropriate for the composition of TI regions 136 may include, for example, borophosphosilicate glass (BPSG), spin-on glass and/or spin-on polymers, other insulators having an effective dielectric constant of less than approximately 3.9, and/or other currently known or later-developed materials having similar properties.

Structure 100 may include several semiconductor regions 104 adjacent and/or confined within TI regions 102. Semiconductor regions 104 may have a dopant to provide a selected polarity, i.e., P-type doping or N-type doping, to enable electrical functions of a transistor or other active electrical component. A "dopant" refers to an element introduced into semiconductor to establish either p-type (acceptors) or n-type (donors) conductivity. In the case of a silicon substrate, common dopants may include, e.g., boron (B), and/or indium (In), for p-type doping. For n-type doping, the doped element(s) may include, for example, phosphorous (P) arsenic (As), and/or antimony (Sb). Doping is the process of introducing impurities (dopants) into the semiconductor substrate, or elements formed on the semiconductor substrate, and is often performed with a mask (e.g., a film of photoresist material and/or other component to block dopants) in place so that only certain areas of the substrate will be doped. In the example of doping by implantation, an ion implanter may be employed. In further examples, in-situ doping or other doping techniques may be used.

Structure 100 may include multiple structures extending lengthwise over TI regions(s) 102 and semiconductor regions 104. For example, structure 100 may include a set (i.e., one or more) of first gate structures 106 and a set of second gate structure 108 over semiconductor regions 104. In the example of FIG. 1, structure 100 includes two first gate structures 106 and one second gate structure 108, but the number of gate structures 106, 108 may differ in various implementations. Each first gate structure 106 may include a gate body 110 over TI region(s) 102 and/or semiconductor regions 104. Gate body(ies) 110 within first gate structure 106, may be formed of polycrystalline silicon or an amorphous silicon. In this example, gate body(ies) 110 may be a "dummy gate" material for removal and replacement in subsequent processing. In still further embodiments gate body(ies) may include conductive metal(s) and/or other types of materials. Second gate structure 108, in some implementations, may include a gate contact 116 including, among other things, one or more conductive materials (e.g., one or more high work function metals) suitable to provide a gate contact for a transistor. Gate body(ies) 110 may be formed from doped or undoped polycrystalline silicon (poly-Si) according to one example. In further examples, gate body 110 may include materials such as, but not limited to, aluminum (Al), zinc (Zn), indium (In), tin (Sn), tantalum (Ta), tantalum nitride (TaN), tantalum carbide (TaC), titanium (Ti), titanium nitride (TiN), titanium carbide (TiC), tungsten (W), tungsten nitride (WN), tungsten carbide (WC), and/or combinations thereof.

Applying a voltage to gate contact 116 of second gate structure 108 may put underlying areas of semiconductor region 104 in an operational state, e.g., allowing charge carriers to flow within semiconductor region 104. Gate body 110 may be differentiated from gate contact 116, e.g., by not producing the same effect when subject to an applied voltage. Various spacers 112 (e.g., layers of insulating material) may be included within and/or formed on sidewalls of gate structure(s) 106, 108. Spacers 112 are illustrated in FIG. 1 as only being on second gate structure 108, but this is not necessarily true in all implementations.

Structure 100 may include several source/drain (S/D) contacts 114 on semiconductor region 104, e.g., each adjacent one first gate structure 106 and on opposite sides of second gate structure 108. S/D contacts 114 may include a pair of contacts adjacent a respective sidewall of second gate structure 108 to define source and drain terminals of a functional transistor structure and/or other device. S/D contacts 114 may extend vertically above structure 100 to overlying metal wires and/or vias and may be formed by deposition of conductive materials.

One or more second gate structures 108 of structure 100 may include gate contact 116, e.g., to define a conductive contact and/or terminal of an active device. In the case of a transistor, applying a voltage to gate contact 116 and second gate structure 108 can enable current flow through semiconductor region 104 below second gate structure 108. In some cases, gate contact 116 may be structurally incorporated into a material similar to gate body 110 of first gate structure 106, e.g., by having a same composition as gate body 110 but being doped P-type or N-type to provide conductivity. Otherwise, gate contact(s) 116 may have one or more conductive materials otherwise used to form or define S/D contacts 114. First gate structures 106 may differ from second gate structure 108 by not including gate contact 116 and/or other conductive materials therein. Thus, first gate structures 106 may be operationally inactive and present in structure 100 primarily or solely to constrain the growth of additional doped material(s) formed on semiconductor region 104, and/or to maintain constant gate pitch for improved manufacturability and/or to prevent electrical shorting from S/D contacts 114 to other active components. In still further embodiments, other portions of first gate structure 106 (e.g., those not included within structure 100) may include gate contact(s) 116.

Figure 2:
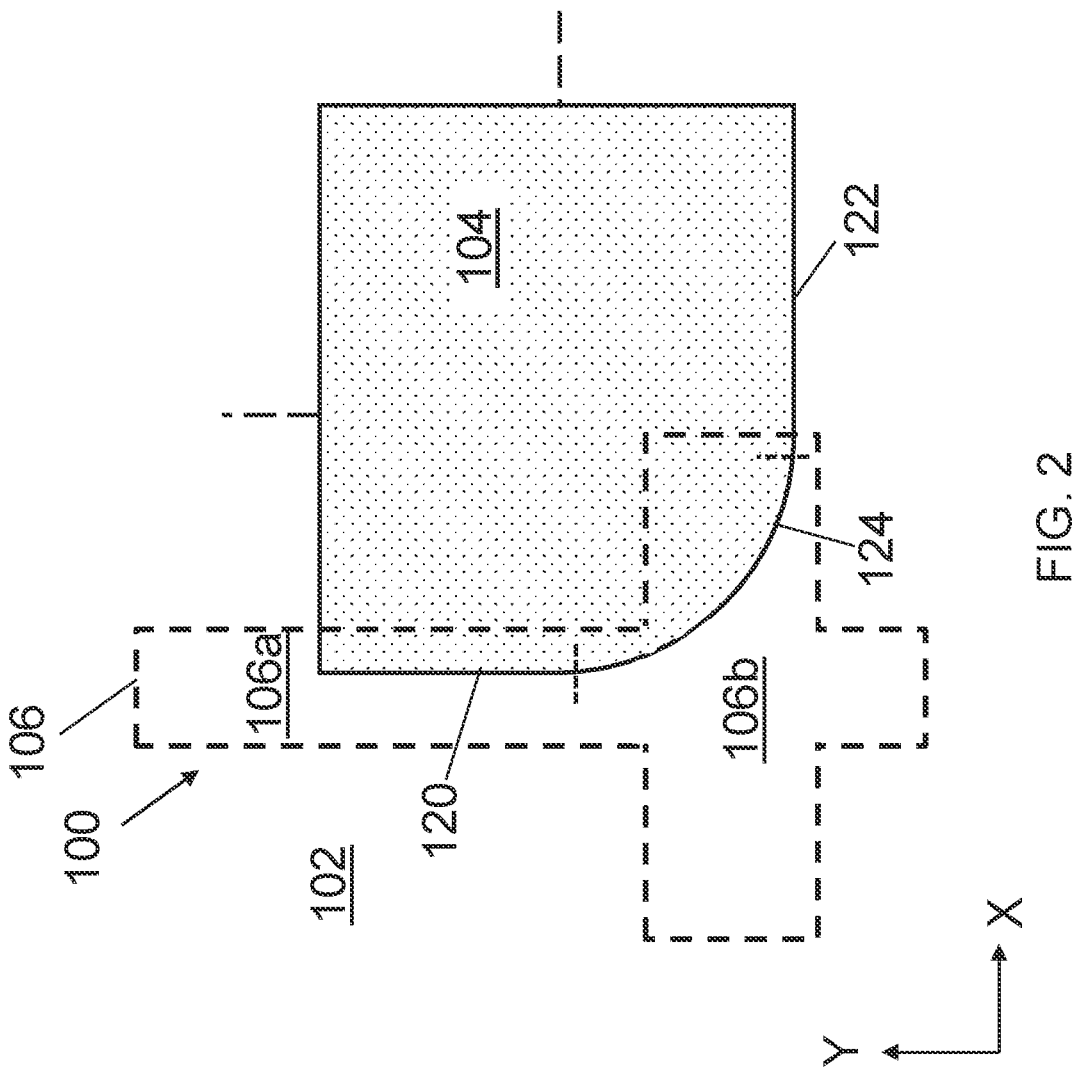
FIG. 2 shows an enlarged plan view of a structure according to embodiments of the disclosure.

Referring to FIGS. 1 and 2 together, in which FIG. 2 provides an expanded view of semiconductor region 104 with overlying portions of first gate structure 106 shown in dashed lines, additional features of structure 100 are described. Semiconductor region 104 may include a first edge 120, e.g., at widthwise end of semiconductor region 104, and a second edge 122, e.g., at a lengthwise end of semiconductor region 104. First edge 120 and second edge 122 may have different orientations, e.g., they may be substantially perpendicular to each other or otherwise may have any non-parallel orientation with respect to each other. Semiconductor region 104, as well as edges 120, 122, may extend beyond the portion illustrated in FIG. 2 as indicated by the dashed lines.

A corner segment 124 may join first edge 120 of semiconductor region 104 to second edge 122. The term "corner segment," as used herein, may refer to any non-linear segment joining one edge of semiconductor region 104 to another. In the case where semiconductor region 104 is quadrilateral, it may have four corner segments 124. However, the number of corner segments 124 may vary depending on the number of interconnected edges featured in semiconductor region 104. It has been determined that corner segments(s) 124, when not covered by overlying materials, may negatively affect the shape and size of epitaxial semiconductor material(s) formed on semiconductor region 104, and/or may pose a risk of other structural defects arising from S/D contact 114 (FIG. 1) placement. Specifically, S/D contact(s) 114 may "punch through" semiconductor region 104 to enter the underlying substrate material if they are wrongfully formed on corner segment(s) 124. "Punch through" may occur, in part, due to the different compositions and/or material densities of semiconductor region 104 along corner segments 124.

Embodiments of structure 100 avoid the above-noted and other technical concerns by sizing and positioning first gate structure(s) 106 over semiconductor region 104 such that first gate structure(s) 106 entirely cover corner segment(s) 124. FIGS. 1 and 2 depict one example in which first gate structure 106 includes a first portion 106a extending over first edge 120 of semiconductor region 104, as well as adjacent TI region(s) 102. First gate structure 106 also may include a second portion 106b adjacent first portion 106a. Second portion 106b may be differently sized (e.g., wider) than first portion 106a such that it entirely covers corner segment 124 and any nearby portions of first edge 120 and second edge 122. The greater width of second portion 106b relative to first portion 106a may arise from a variety of sources, e.g., inactive semiconductor material of first gate structure 106 being formed with a differently sized mask in second portion 106b and/or being etched back in first portion 106a to yield different widths. In any case, S/D contact(s) 114 (FIG. 1) may be substantially horizontally aligned (e.g., along the X-axis) with first portion 106a to prevent physical overlap between S/D contact(s) 114 and second portion 106b of first gate structure 106.

Further embodiments of the disclosure discussed herein may provide other structural features for covering corner segment(s) 124 while preserving space over semiconductor region 104 to form S/D contact(s) 114. The distance S between S/D contact(s) 114 and second portion 106b of second gate structure 106 may be selected to be greater than zero (e.g., fifty nanometers, one micrometer, etc.) to further prevent overlap between second portion 106b and S/D contact(s) 114, according for variations in S/D contact 114 placement. It is noted that second gate structure 108, in contrast to first gate structure 106, may have a uniform width over semiconductor region 104, e.g., because no corner segments 124 are located thereunder and/or to preserve the active functions of second gate structure 108 in a transistor (or other device).

Figure 3:
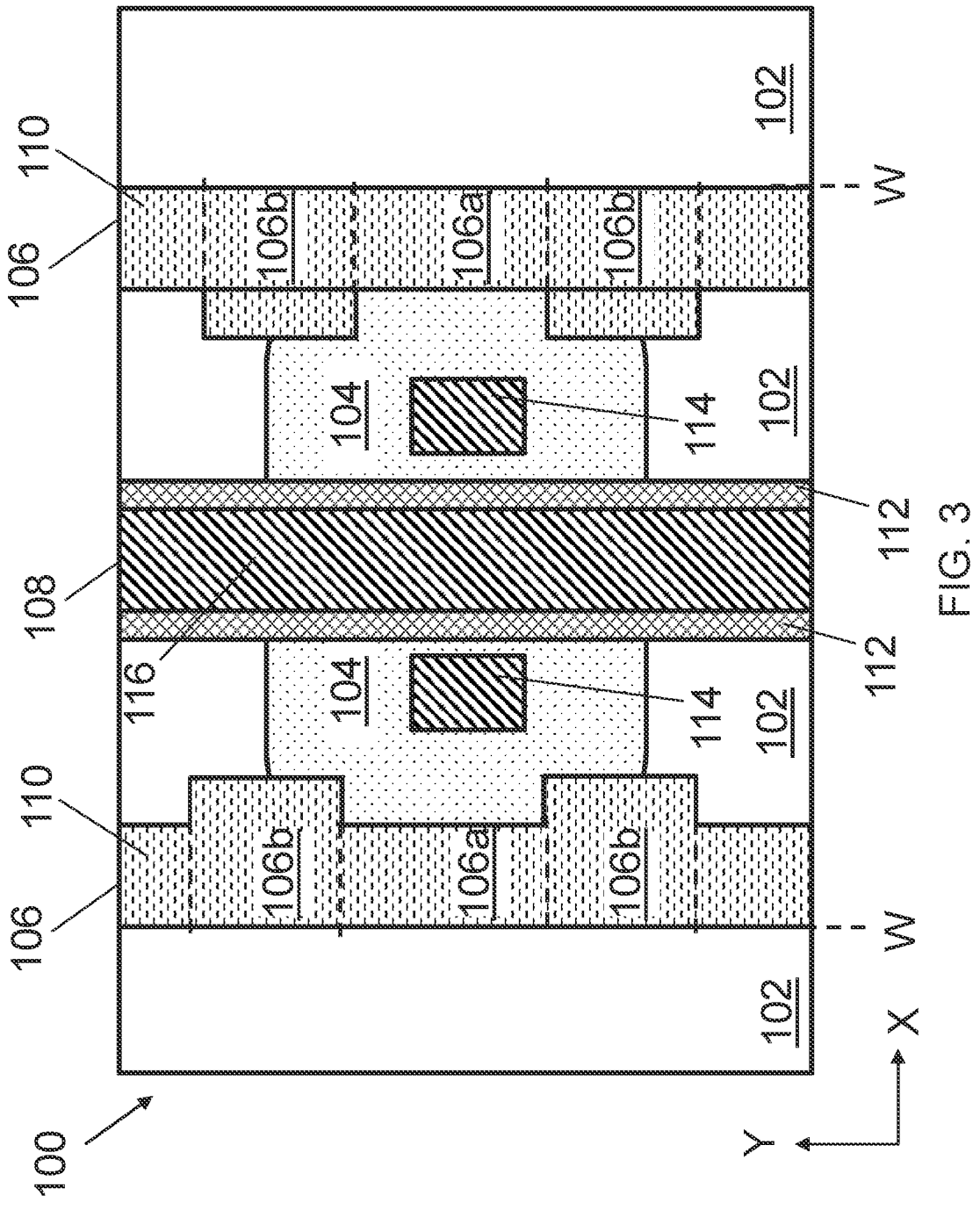
FIG. 3 shows a plan view of a structure with asymmetric gate structures according to embodiments of the disclosure.
Figure 4:
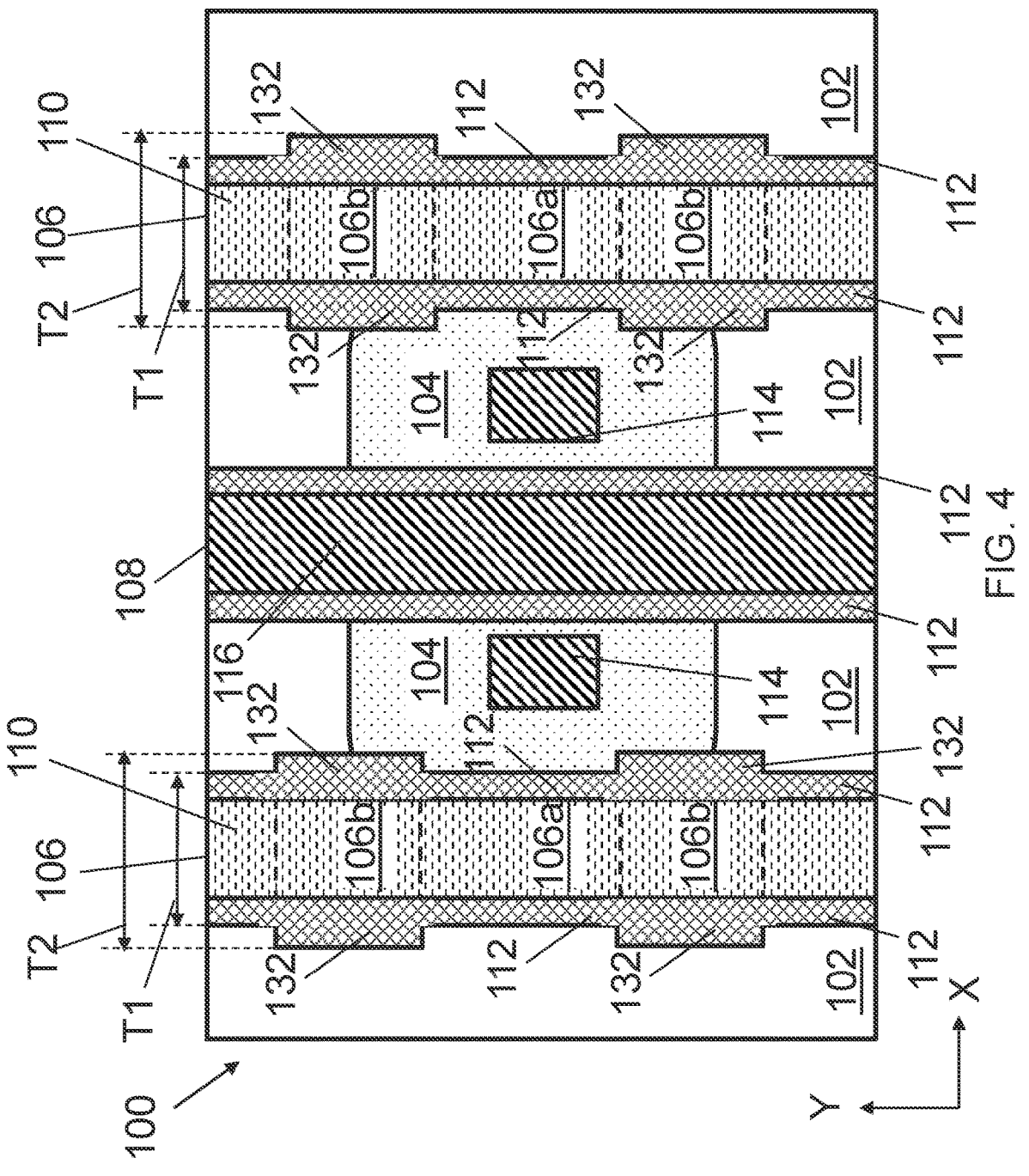
FIG. 4 shows a plan view of a structure with enlarged gate spacers according to embodiments of the disclosure.
Figure 5:
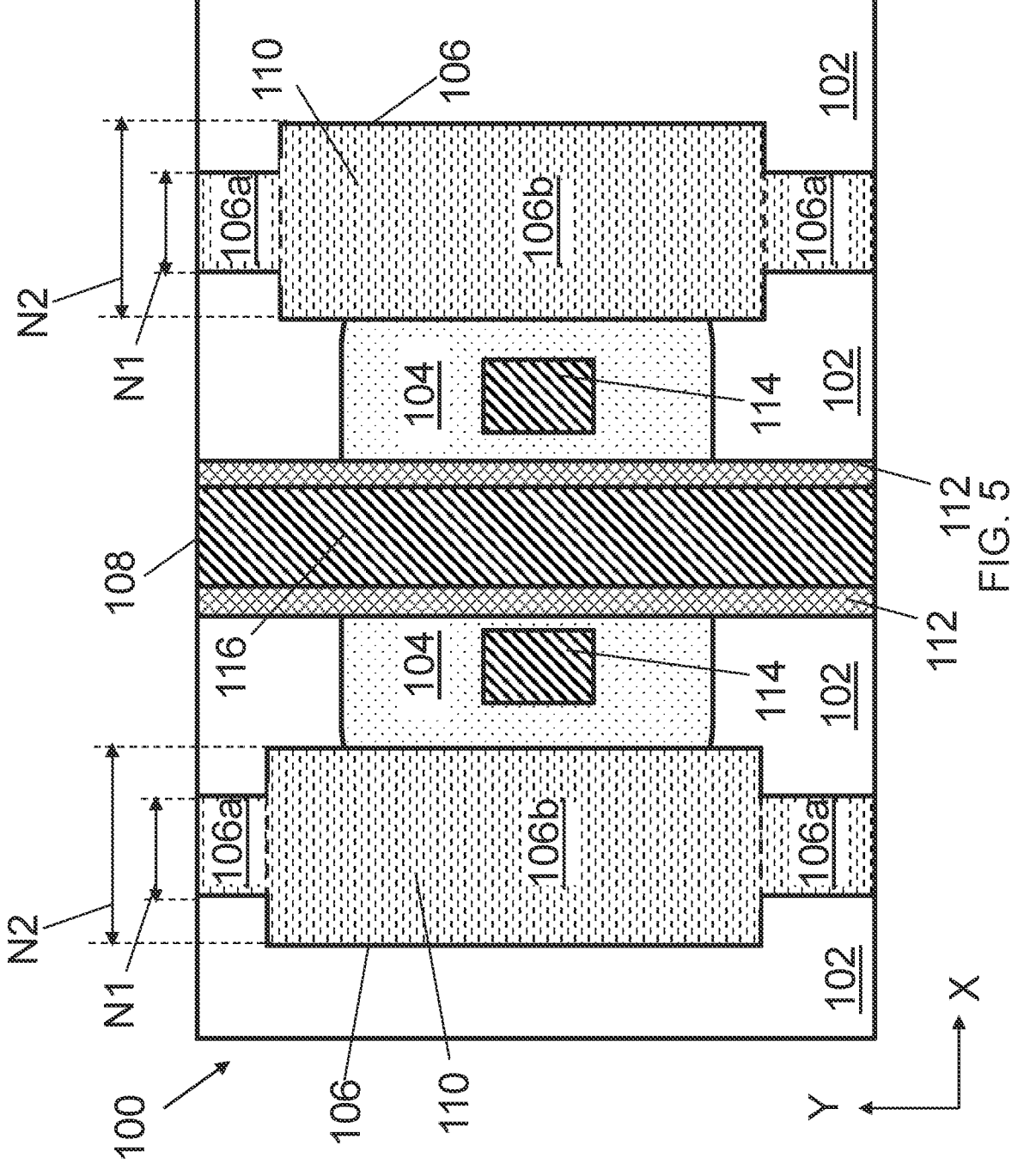
FIG. 5 shows a plan view of a structure with gate structures of larger width over the length of a semiconductor region according to embodiments of the disclosure.

FIGS. 3-5 depict further implementation of structure 100, in which first gate structure 106 includes differing widths in first portion 106a and second portion 106b, but with further structural features. It is understood that the various implementations discussed herein may be combined in various aspects and/or may be implemented together as portions of a larger device. Corner segment(s) 124 (FIG. 2), though not shown explicitly in FIGS. 3-5, may occupy(ies) the same position and/or similar positions to that shown in FIG. 2 and discussed elsewhere herein.

FIG. 3 depicts an implementation where first gate structures 106 are asymmetric about their lengthwise centerline axis. In this case, second portions 106b may protrude along the width of first gate structure 106 over corner segment 124 (FIG. 2), but do not similarly protrude along the width in the opposite direction. In this case, portions 106*a*, 106*b* of each first gate structure 106 may have a shared sidewall W that extends continuously along the length of first gate structure 106, but not on the opposite horizontal end.

FIG. 4 depicts a further example of structure 100 in which gate body 110 of first gate structure 106 are of uniform width but include differently sized spacer structures adjacent thereto. For example, first portion 106*a* may have spacer 112 with a first width T1 that is of a similar width to spacers 112 of second gate structure 108, whereas second portion 106*b* may have a spacer 132 of a second width T2 that is substantially larger than first width T1 of spacer 112 to cover corner segment(s) 124 (FIG. 2) thereunder. Thus, the differences in size and shape between portions 106*a*, 106*b* may be achieved by variations and/or modification in the processing of spacer(s) 112, 132 on first gate structures 106.

FIG. 5 depicts yet another example in which S/D contacts 114 are horizontally between second portion 106*b* and second gate structure 108, rather than being horizontally between first portion 106*a* and second gate structure 108. Here, gate body 110 of first gate structure 106 may have second portion 106*b* with a larger width N2 than a width N1 of an adjacent first portion 106*a*. Hence, second portion 106*b* is entirely over first edge 120 (FIG. 2) and corner segment 124 (FIG. 2) throughout semiconductor region 104. In this implementation, S/D contact(s) 114 may be closer to first gate structure(s) 106 than in other implementations of structure 100. However, first gate structure(s) 106 may be able to further constrain the growth of any semiconductor materials over semiconductor region 104, e.g., by traversing an entire length of semiconductor region 104.

Figure 6:
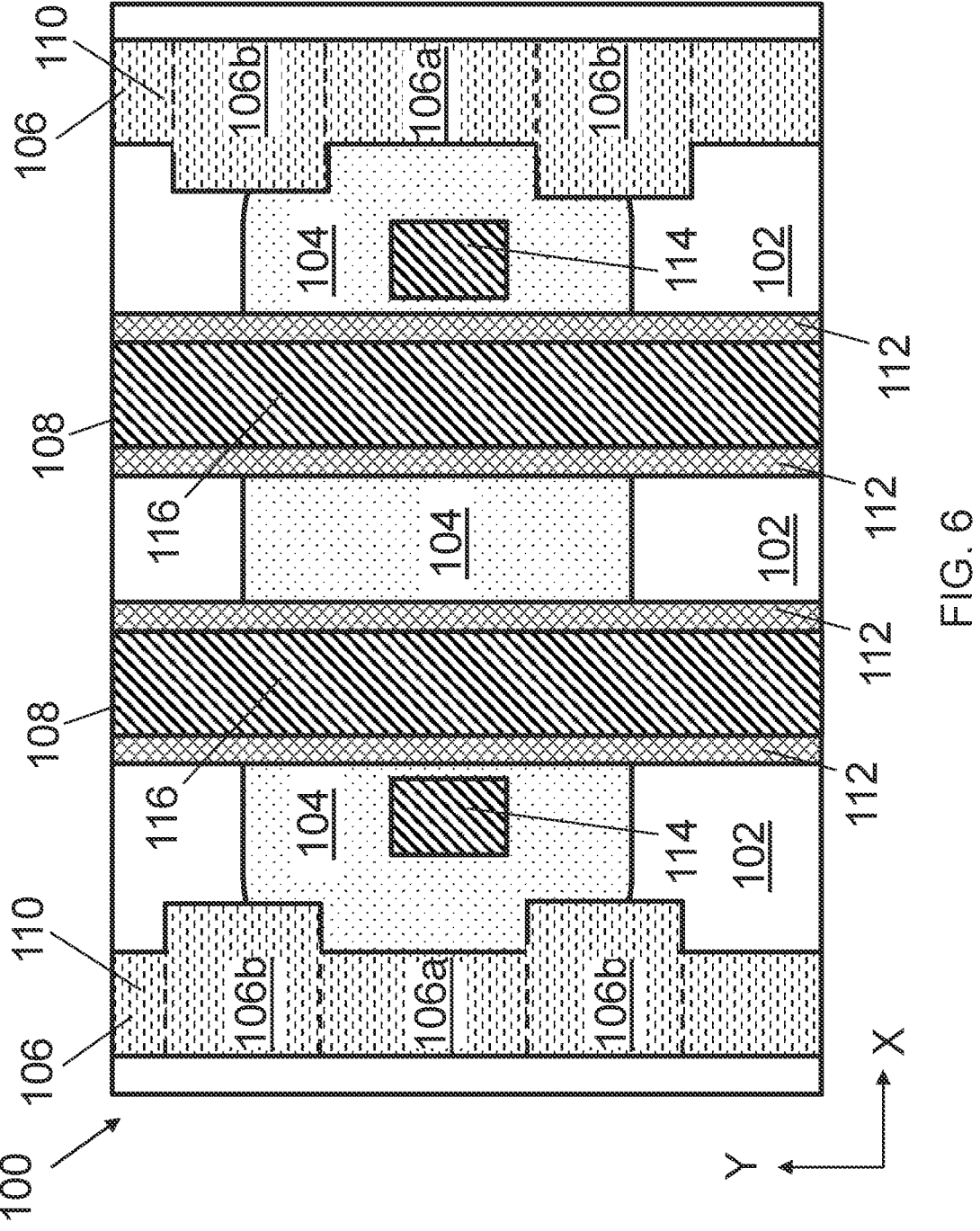
FIG. 6 shows a plan view of a structure with a plurality of active gate structures according to embodiments of the disclosure.

FIG. 6 depicts a further implementation of structure 100. In this embodiments, multiple second gate structures 108 are provided over semiconductor region 104. Here, each second gate structure 108 may be embodied as and/or may include an active gate component for defining at least a portion of a transistor or similar device over semiconductor region 104. First gate structures 106 may be located at the widthwise ends of semiconductor region 104, e.g., to extend along the length of semiconductor region 104 at its opposite ends. Each semiconductor region 104, located between two gate structures 108, may or may not contain a S/D contact 114 depending on the intended functionality of the device. Despite the inclusion of multiple second gate structures 108, first gate structures 106 may be the same and or similar to other implementations of structure 100 discussed herein. That is, first gate structures 106 may entirely cover any corner segment(s) 124 of semiconductor region 104 despite the presence of multiple second gate structures 108. Thus, embodiments of structure 100 may be implemented even where multiple active gates (e.g., second gate structures 108) are over semiconductor region 104.

Figure 7:
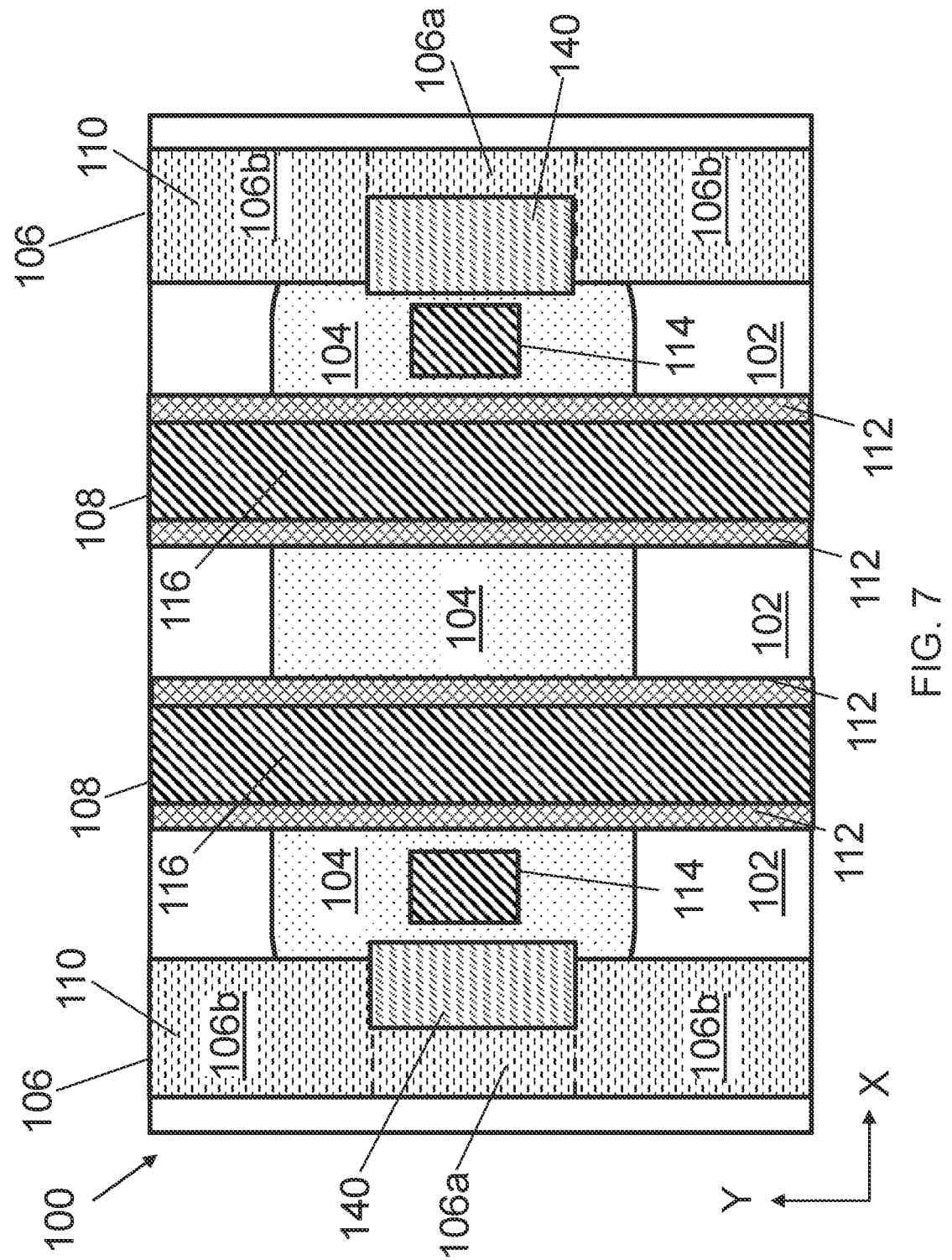
FIG. 7 shows a plan view of a structure with masking material over a semiconductor region according to embodiments of the disclosure.

FIG. 7 depicts yet another implementation of structure 100 in which additional material(s) may be formed on first gate structure(s) 106, e.g., to further protect against punch through of semiconductor region 104 and/or shorting between first gate structure(s) 106 and S/D contact(s) 114. Here, structure 100 may include a masking material 140 over semiconductor region 104 and first gate structure 106 (e.g., over first portion 106*a* thereof). Masking material 140 may include any now known or later developed appropriate masking material, e.g., a nitride hard mask including silicon nitride (SiN) or similar insulating materials. In some implementations, masking material 140 may take the form of a "gate cut mask" otherwise used for targeting and removing portions of gate body 110 of first gate structure 106 and/or other materials. In implementations where masking material 140 is present, first gate structure 106 may extend lengthwise over first edge 120 (FIG. 2) and corner segment 124 (FIG. 2) of semiconductor region 104 and may have a uniform width. Masking material 140, in this case, may be included to prevent electrical shorting from gate body 110 to S/D contact 114. Masking material 140 thus may be horizontally between S/D contact(s) 114 and first gate structure 106. In some cases, S/D contact(s) 114 may abut a portion of masking material 140. Similar to other embodiments discussed herein, structure 100 optionally may include several first gate structure 106 and/or second gate structure 108 despite masking material 140 being included.

Figure 8:
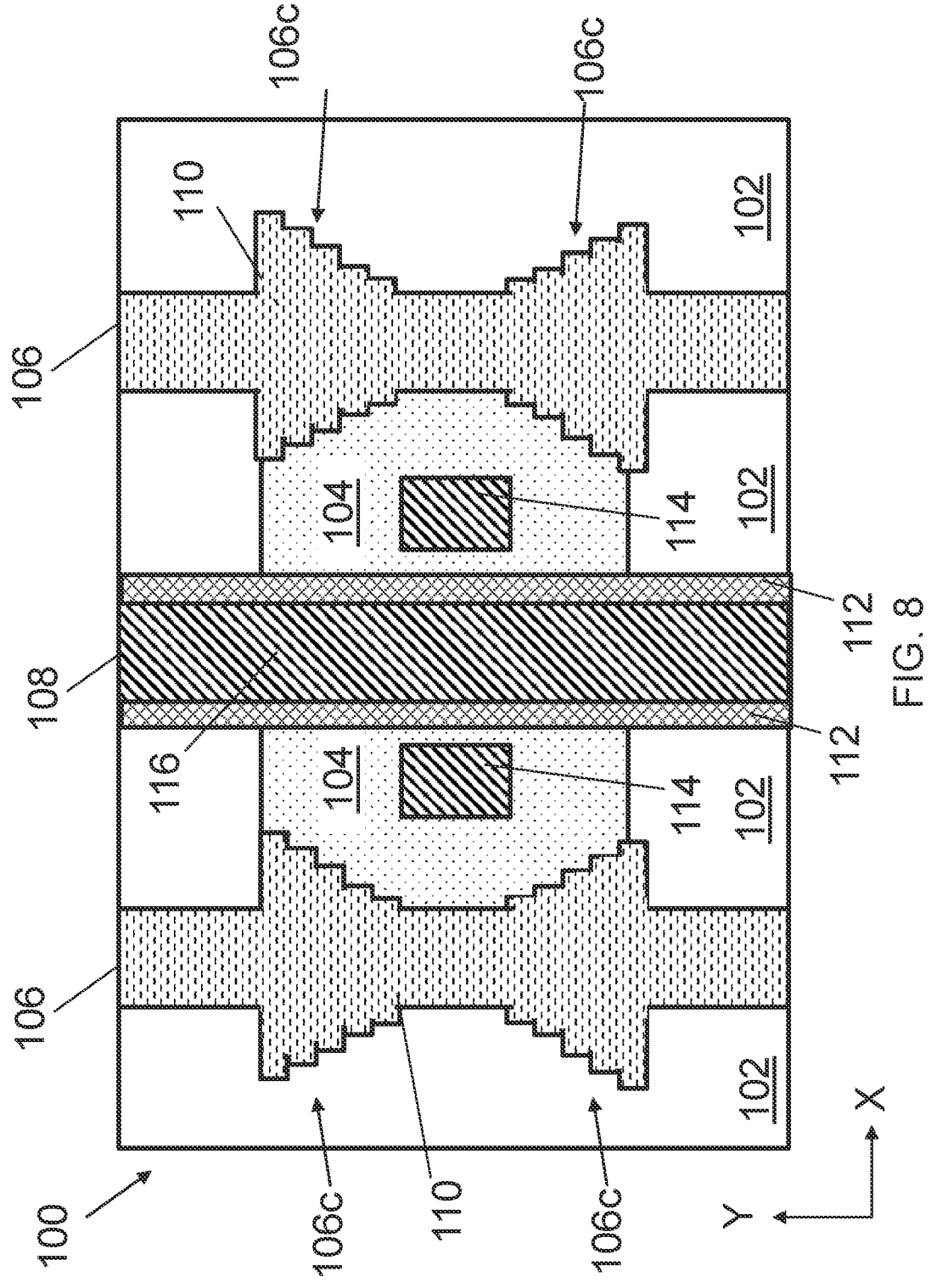
FIG. 8 shows a plan view of a structure with a gate structure having a plurality of widths according to embodiments of the disclosure.

FIG. 8 depicts a further embodiment of structure 100 in which first gate structure(s) 106 optionally may include a plurality of graded protrusions 106*c* extending horizontally outward from gate body 110. Graded protrusions 106*c* may have a similar or identical composition to material(s) within gate body 110 of first gate structure 106 and/or other gate structure materials discussed herein. Graded protrusions 106*c* may have a changing width with respect to their lengthwise position adjacent gate body 110 of first gate structure 106. For instance, graded protrusion(s) 106*c* may be widest at a lengthwise end of semiconductor region 104 (e.g., to cover corner segment 124 (FIG. 2)) and may be smallest at a position nearest to S/D contact(s) 114 (e.g., to avoid electrical contact between S/D contact(s) 114 and graded protrusions 106*c*). Graded protrusions 106*c* are shown as a group of adjacent rectangular protrusions, but they may have any desired geometry. In further examples, graded protrusion(s) 106*c* may have a curvilinear sidewall over corner segment(s) 124 while also being located apart from S/D contact(s) 114.

Figure 9:
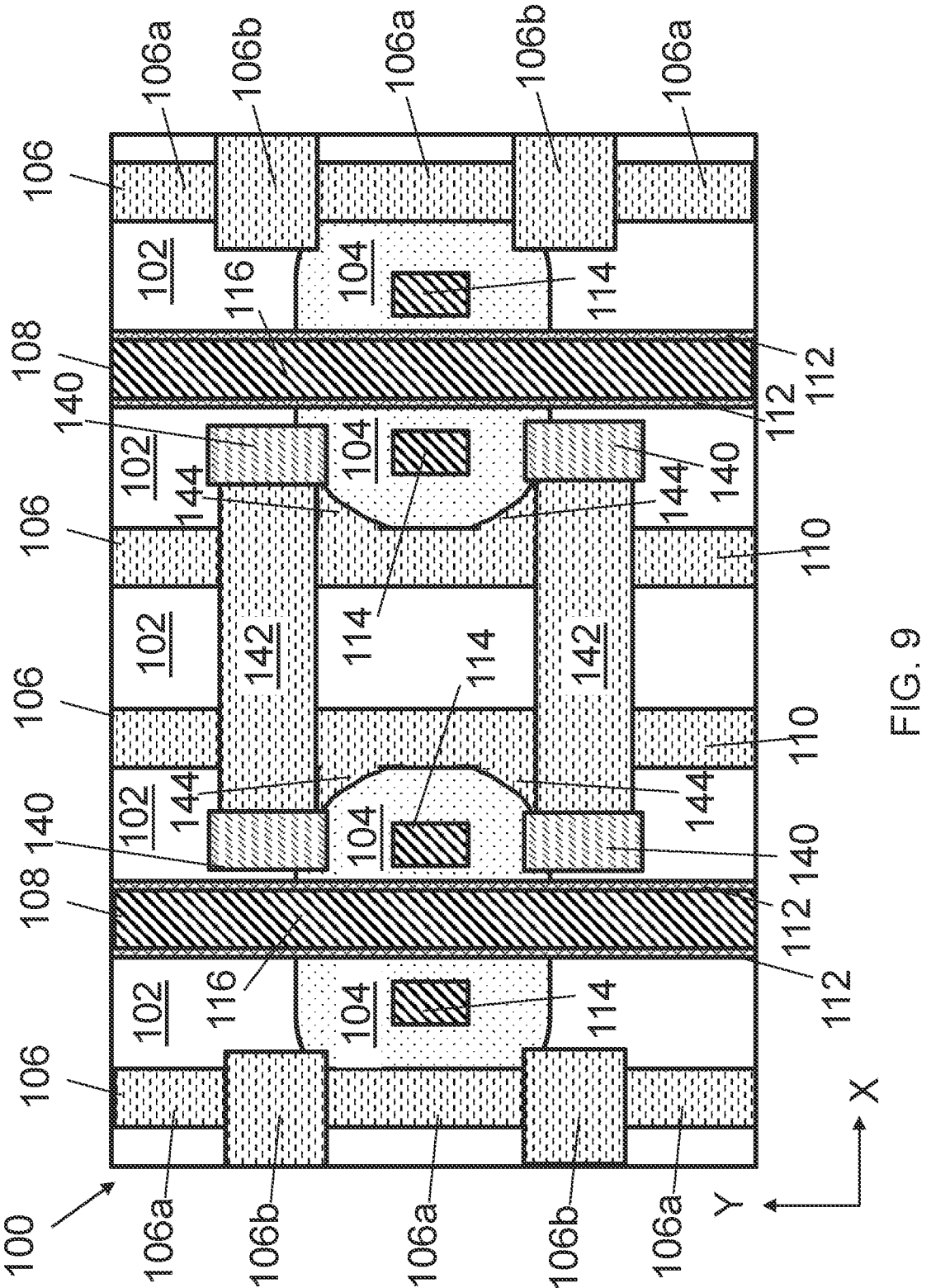
FIG. 9 shows a plan view of a structure with a gate strap and masking material according to embodiments of the disclosure.

FIG. 9 depicts a further implementation of structure 100 in which masking material 140 is formed in other locations with various additional structures to assist in covering corner segment(s) 124 (FIG. 2). In this case, first gate structure(s) 106 may include one or more gate straps 142 (e.g., two shown) extending in a widthwise direction over TI region(s) 102 and over portions of semiconductor region 104. Gate straps 142 may interconnect two or more first gate structures 106 and may include the same and/or similar material(s) to gate body 110 of first gate structures 106. Gate straps 142 may be differentiated from first gate structure(s) 106 solely by extending widthwise over TI region(s) 102 and semiconductor region 104, instead of lengthwise. Masking material 140 may be over gate strap(s) 142 instead of gate body 110 of first gate structure(s) 106 to cover certain portions of corner segment(s) 124, and/or second edge 122 (FIG. 2) of semiconductor region 104 where desired. The masking material 140 intends to prevent electrical short between the second gate structure 108 and the gate strap 142 and the masking material 140 can be a "gate cut mask" in one implementation. First gate structure 106, optionally, also may include a transition segment 144 between gate body 110 and gate strap 142 to increase coverage of first gate structure 106 over corner segment(s) 124. Transition segment(s) 144 may include, e.g., curved sidewalls to cover portions of semiconductor region 104 without being in close proximity with S/D contact(s) 114. Transition segment(s) 144 may arise as process-related corner rounding when they are part of the same fabrication step together with the first gate structure 106. In all other respects, structure 100 (including semiconductor region 104, S/D contact(s) 114, second gate structure 108) may be the same as, or similar to, other embodiments discussed herein.

Figure 10:
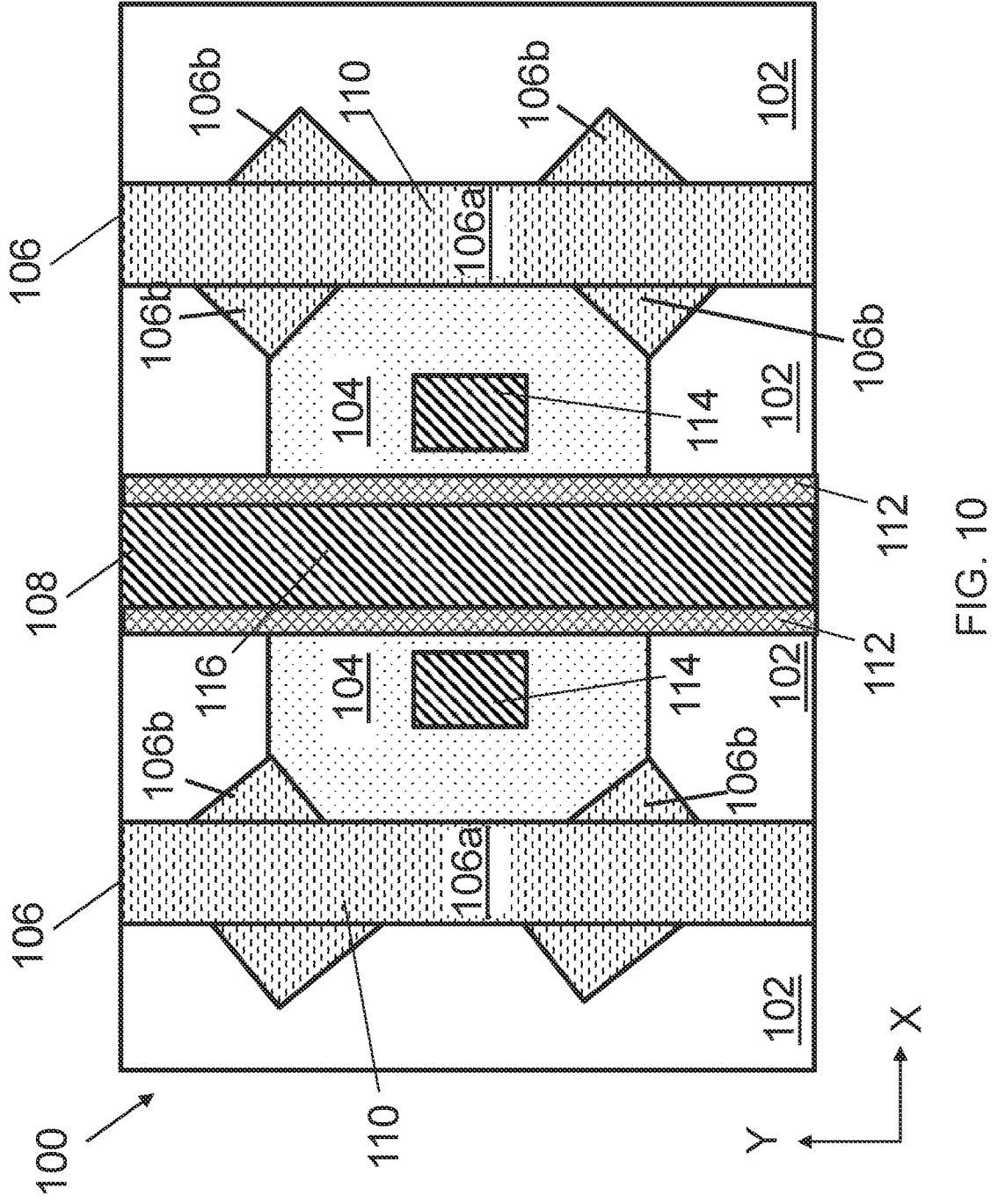
FIG. 10 shows a plan view of a structure with multiple non-perpendicular gate structures according to embodiments of the disclosure.

FIG. 10 depicts yet another implementation of structure 100 capable of being combined with and/or implemented separately from other embodiments of structure 100 discussed herein. Second portion(s) 106*b* of first gate structure 106, even when rectangular in shape, may be oriented out of parallel or perpendicular alignment with edges 120, 122 (FIG. 2) of semiconductor region. FIG. 10 depicts second portion(s) 106*b* as extending diagonally over semiconductor region 104, e.g., to cover corner segment(s) 124 thereof without further modifying the shape of second portion(s) 106*b*. Thus, second portion(s) 106*b* may have any desired shape regardless of how structure 100 is otherwise structured. That is, in addition to substantially rectangular shapes, second portion(s) 106*b* may have any desired shape as well as any desired orientation to cover corner segment(s) 124 of semiconductor region 104.

Figure 11:
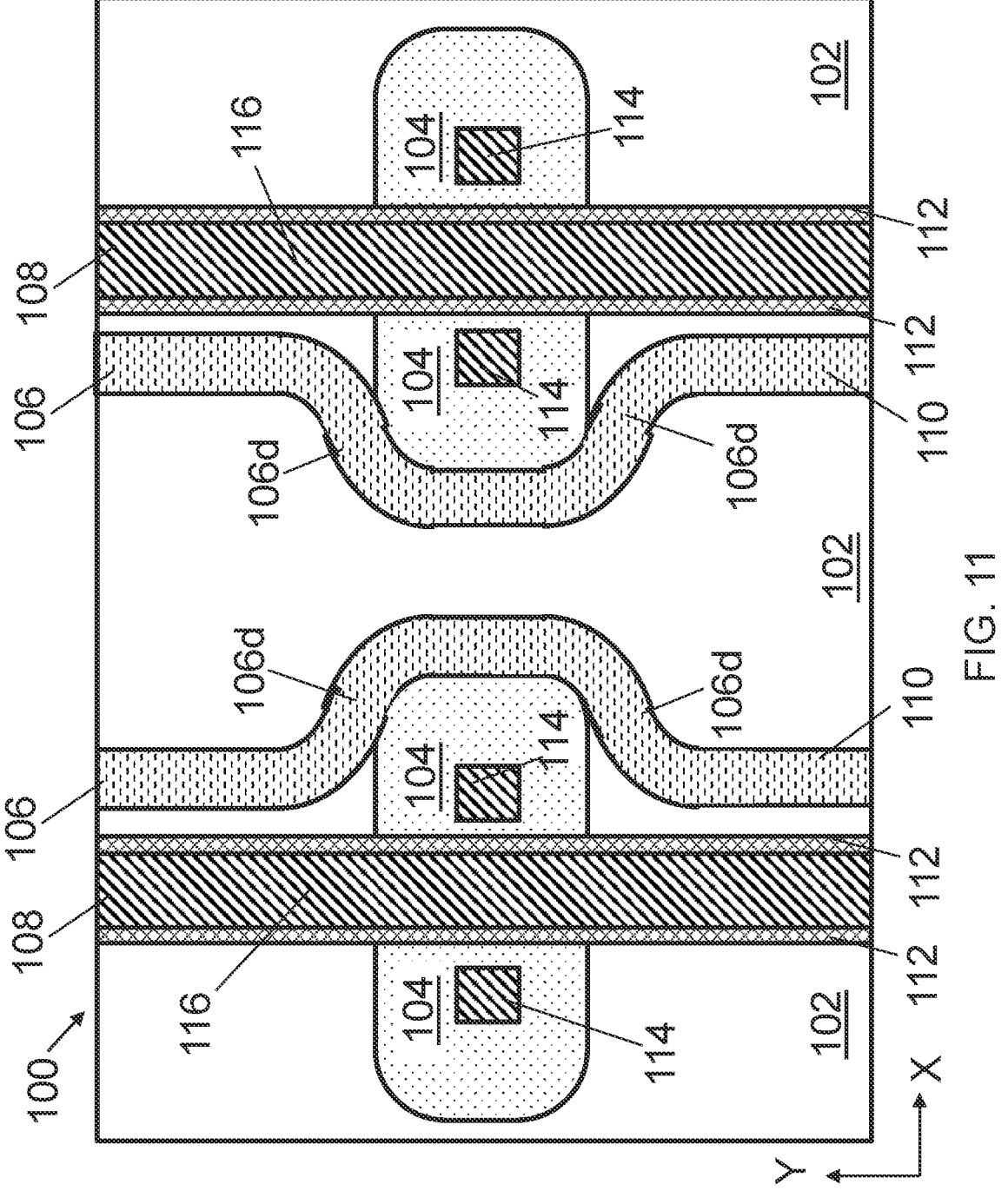
FIG. 11 shows a plan view of a structure with curvilinear gate structures according to embodiments of the disclosure.

According to further implementations, and as shown in FIG. 11, first gate structure 106 may have a partially curvilinear shape over TI region(s) 102 and semiconductor region 104 for covering corner segment(s) 124. Here, first gate structure 106 may have a substantially uniform width but may be shaped to extend over corner segment(s) 124 of semiconductor region(s) 104 to compensate for the absence of any protrusions and/or wider segments of gate body 110 of first gate structure 106. First gate structure 106 thus may include one or more curvilinear segments 106*d* over corner segment(s) 124. Other portions of first gate structure 106 (whether curved or not) may cover first edge 120 (FIG. 2) of semiconductor region 104 such that first gate structure 106 entirely covers first edge 120 and corner segment(s) 124. Structure 100 otherwise may be similar to and/or combinable with other implementations of structure 100 described herein, notwithstanding the presence of curvilinear segments 106*d*.

Embodiments of the disclosure provide various technical and commercial advantages, examples of which are discussed herein. Structure 100, however implemented, may laterally constrain any raised source or drain materials to be grown on semiconductor region(s) 104. Among other benefits, this constraining of overlying semiconductor material may improve the shape of any boundaries for silicidation growth above corner segment(s) 124 of semiconductor region 104. Furthermore, as discussed herein, first gate structure(s) 106 may prevent punch-through of S/D contact (s) 114 into underlying substrate material due to the covering of relatively weak material in corner segment(s) 124. In addition, embodiments of structure 100 may vary the width of first gate structure 106 and/or include masking material 140 to prevent electrical shorts from arising between S/D contact(s) 114 and nearby portions of first gate structure 106. The varying shapes and/or implementations of first gate structure 106 and/or other portions of structure 100 allow for high customization and/or a variety of implementation options to suit many devices and operating circumstances.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
a semiconductor region within a substrate, the semiconductor region having a first edge, a second edge oriented perpendicularly to the first edge, and a first curvilinear corner segment connecting the first edge to the second edge; and
a first gate structure extending over the first edge, wherein the first gate structure entirely covers the first edge and the first corner segment of the semiconductor region, the first gate structure including:
a first portion over the first edge, wherein the first portion includes a first side and a second side, opposite the first side; and a second portion adjacent the first portion and over the first corner segment, wherein the second portion extends horizontally beyond the first side and the second side of the first portion.

2. The structure of claim 1, further comprising a contact to the semiconductor region substantially horizontally aligned with the first portion of the first gate structure.

3. The structure of claim 1, further comprising a second gate structure over the semiconductor region, the second gate structure including a gate conductor over the semiconductor region.

4. The structure of claim 1, wherein the semiconductor region includes a third edge oriented perpendicularly to the first edge, and a second corner segment connecting the first edge to the third edge, wherein the first gate structure is also over the second corner segment of the semiconductor region.

5. The structure of claim 3, wherein the first gate structure is oriented substantially parallel with respect to the second gate structure.

6. The structure of claim 3, wherein the second gate structure is one of a plurality of second gate structures over the semiconductor region, each of the second gate structures including the gate conductor.

7. The structure of claim 1, wherein the first gate structure is one of a plurality of first gate structures over the semiconductor region.

8. A structure comprising:
a semiconductor region within a substrate, the semiconductor region having a width between a first edge and a second edge; and
a first gate structure extending over the first edge of the semiconductor region, wherein the first gate structure includes:
a gate body over the first edge of the semiconductor region;
a first spacer adjacent the gate body along a length of a first portion of the first gate structure; and
a second spacer adjacent the gate body along a length of a second portion of the first gate structure, wherein a width of the first spacer is greater than a width of the second spacer,
wherein the first portion of the gate structure and the second portion of the first gate structure are colinear.

9. The structure of claim 8, further comprising a second gate structure over the semiconductor region, the second gate structure including a gate conductor over the semiconductor region.

10. The structure of claim 9, wherein the second gate structure is one of a plurality of second gate structures over the semiconductor region, each of the second gate structures including the gate conductor.

11. The structure of claim 9, wherein the first gate structure is oriented parallel with respect to the second gate structure.

12. The structure of claim 8, further comprising a contact to the semiconductor region substantially horizontally aligned with the first portion of the first gate structure.

13. The structure of claim 8, wherein the semiconductor region includes a third edge oriented perpendicularly to the first edge, and a second corner segment connecting the first edge to the third edge, wherein the first gate structure is also over the second corner segment of the semiconductor region.

14. The structure of claim 8, wherein the first gate structure is one of a plurality of first gate structures over the semiconductor region.

15. A structure comprising:
a semiconductor region within a substrate, the semiconductor region having a first edge, a second edge oriented perpendicularly to the first edge, and a first corner segment connecting the first edge to the second edge;
a first gate structure extending over the first edge, wherein a portion of the first gate structure over the first edge is curvilinear in a horizontal direction; and
a masking material over the semiconductor region and the first gate structure, wherein the first gate structure and the masking material entirely cover the first edge and the first corner segment of the semiconductor region.

16. The structure of claim 15, further comprising:
a second gate structure on the semiconductor region; and
a source/drain (S/D) contact to the semiconductor region and horizontally between the masking material and the second gate structure, wherein the masking material is between the S/D contact and the first gate structure.

17. The structure of claim 16, wherein the first gate structure is oriented substantially parallel with respect to the second gate structure.

18. The structure of claim 16, wherein the second gate structure includes a gate conductor over the semiconductor region.

19. The structure of claim 18, wherein the first gate structure is one of a plurality of first gate structures over the semiconductor region, the first gate structure being free of the gate conductor.

20. The structure of claim 15, wherein a width of the first gate structure is substantially uniform.

*    *    *    *    *